United States Patent
Nealey et al.

(10) Patent No.: US 7,514,764 B2
(45) Date of Patent: Apr. 7, 2009

(54) MATERIALS AND METHODS FOR CREATING IMAGING LAYERS

(75) Inventors: Paul F Nealey, Madison, WI (US); Tushar S. Jain, San Diego, CA (US); Erik W. Edwards, Council Bluffs, IA (US); Juan J. de Pablo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 377 days.

(21) Appl. No.: 11/386,226

(22) Filed: Mar. 21, 2006

(65) Prior Publication Data

US 2007/0020749 A1    Jan. 25, 2007

Related U.S. Application Data

(60) Provisional application No. 60/664,797, filed on Mar. 23, 2005.

(51) Int. Cl.
*H01L 23/58* (2006.01)
*C12Q 1/68* (2006.01)
*C12M 1/36* (2006.01)

(52) U.S. Cl. .......................... 257/643; 435/6

(58) Field of Classification Search ......... 257/642–644; 428/198, 332; 430/320, 323; 435/6, 7, 174; 438/780
See application file for complete search history.

(56) References Cited

U.S. PATENT DOCUMENTS

| | | | | |
|---|---|---|---|---|
| 6,413,587 | B1 * | 7/2002 | Hawker et al. | 427/264 |
| 6,844,144 | B2 * | 1/2005 | Krause et al. | 430/320 |
| 7,250,253 | B1 * | 7/2007 | Klapproth et al. | 435/6 |
| 2002/0071943 | A1 | 6/2002 | Hawker et al. | |
| 2004/0043335 | A1 | 3/2004 | Krause et al. | |

FOREIGN PATENT DOCUMENTS

WO    WO 00/43539    7/2000

(Continued)

OTHER PUBLICATIONS

Hawker et al., "New polymer synthesis by nitroxide mediated living radical polymerizations," Chemical Reviews 101 (12): 3661-3688 Dec. 2001.

(Continued)

*Primary Examiner*—Calvin Lee
(74) *Attorney, Agent, or Firm*—Weaver Austin Villeneuve & Sampson LLP

(57) ABSTRACT

The present invention provides patterned features of dimensions of less than 50 nm on a substrate. According to various embodiments, the features may be "Manhattan" style structures, have high aspect ratios, and/or have atomically smooth surfaces. The patterned features are made from polymer brushes grafted to a substrate. In some embodiments, the dimensions of the features may be determined by adjusting the grafting density and/or the molecular weight of the brushes. Once the brushes are patterned, the features can be shaped and reshaped with thermal or solvent treatments to achieve the desired profiles. The chemical nature of the polymer brush is thus independent of the patterning process, which allows for optimization of the polymer brush used for specific applications. Applications include masks for pattern transfer techniques such as reactive ion etching.

19 Claims, 15 Drawing Sheets

FOREIGN PATENT DOCUMENTS

| WO | WO 2004/026931 A2 | 1/2004 |
|---|---|---|
| WO | WO 2004/026931 A3 | 1/2004 |

OTHER PUBLICATIONS

Zhao et al., "Polymer brushes: surface-immobilized macromolecules," Progress in Polymer Science 25 (5): 677-710 Jun. 2000.

European Search Report dated Oct. 10, 2006 from related European Application No. 06251517.6 [SRC1P045EP].

Yu et al., "Patterned self-adaptive polymer brushes by "grafting to" approach and microcontact printing," Surface Science 572 (2004) 490-496.

Jones, et al., "Variable Adhesion of Micropatterned Thermosponsive Polymer Brushes: AFM Investigations of Poly (N-isopropylacrylamide) Brushes Prepared b Surface-Initiated Polymerizations," Advanced Materials, vol. 14, No. 16, Aug. 16, 2002, pp. 1130-1134.

Prokhorova et al., "Can polymer brushes induce motion of nano-objects," Institute of Physics Publishing, Nanotechnology, vol. 14, No. 10, Oct. 1, 2003, pp. 1098-1108.

Nagasaki et al., "An Intelligent Polymer Brush," Trends in Polymer Science, Elsevier Science Publishing, vol. 4, No. 2, Feb. 1996, pp. 59-64.

* cited by examiner

301

200 nm h = 12nm Mn = 9720; PDI = 1.34

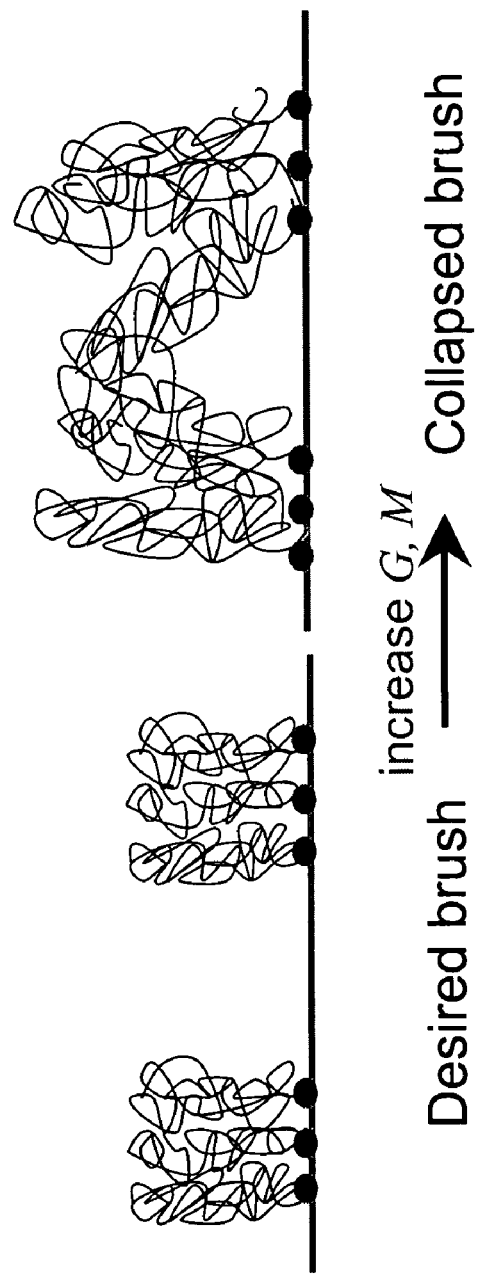

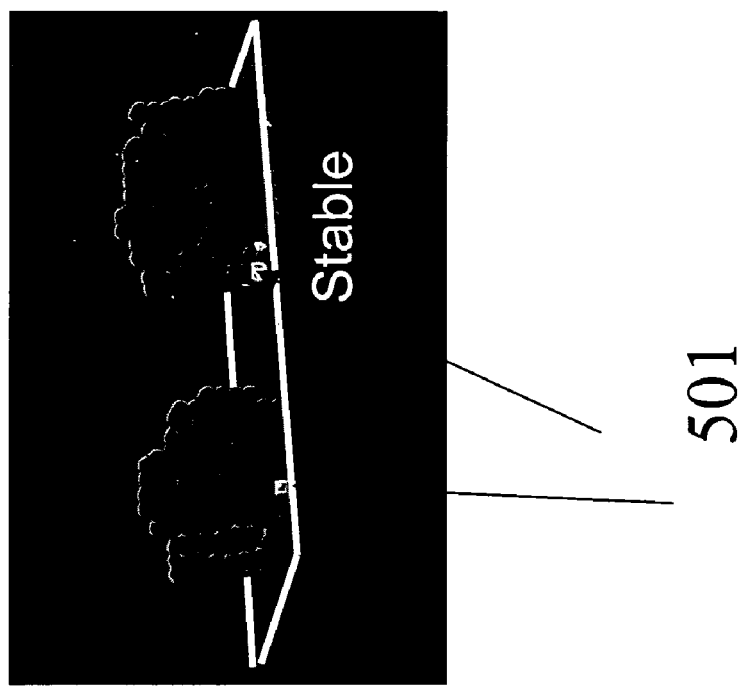
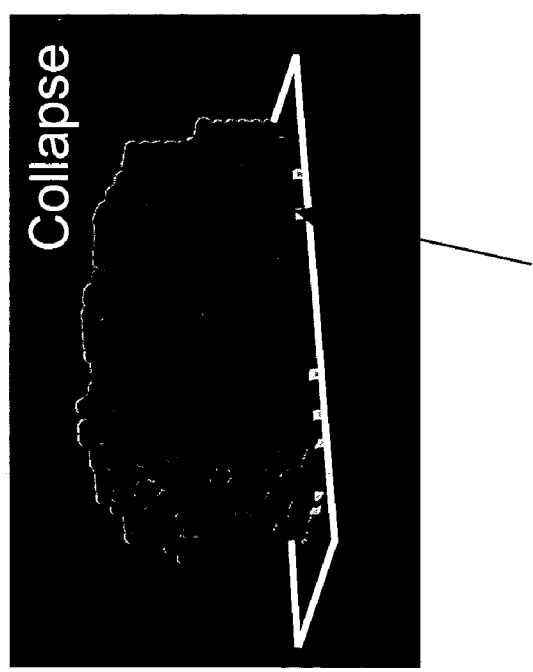
Fig 5b

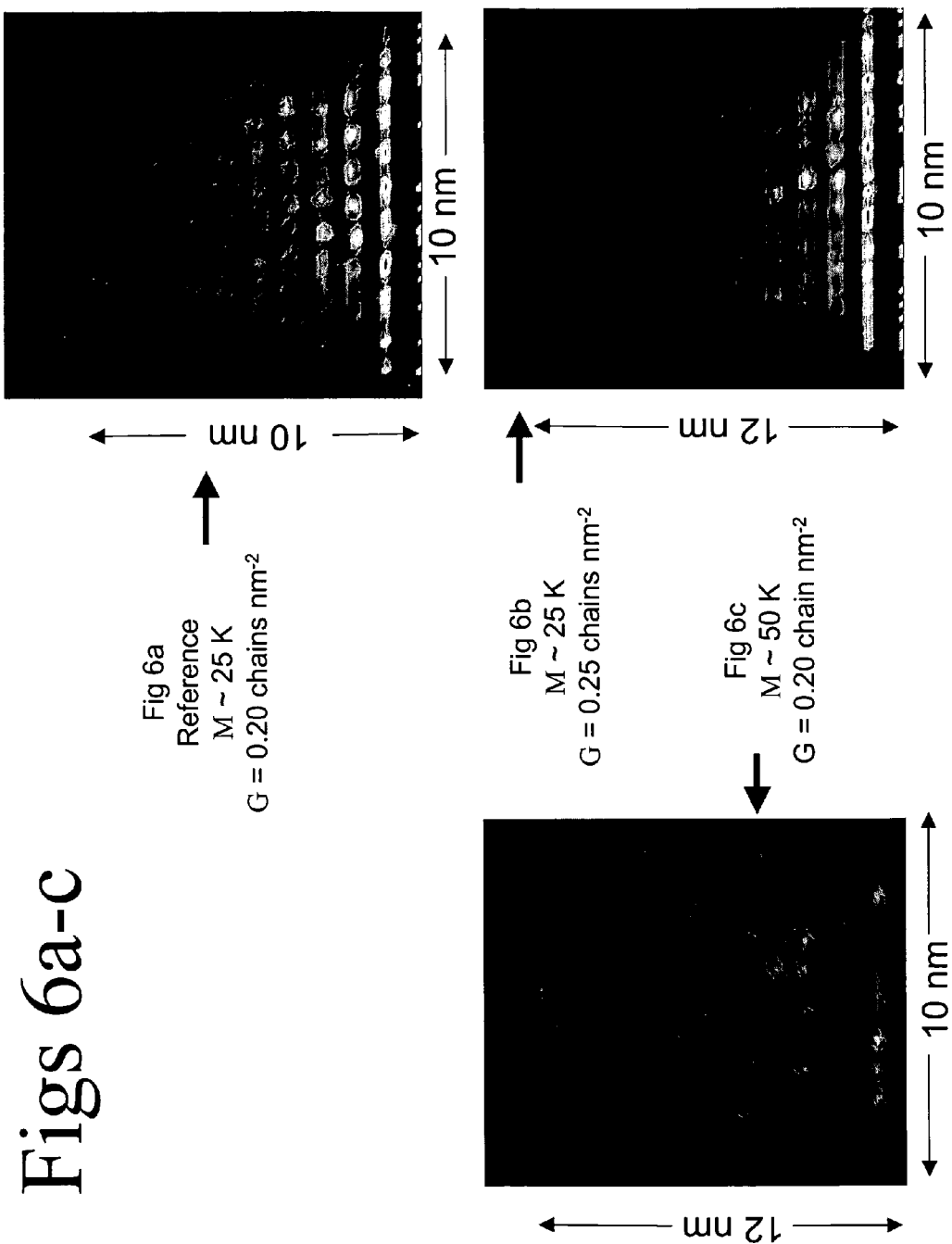
Figs 6a-c

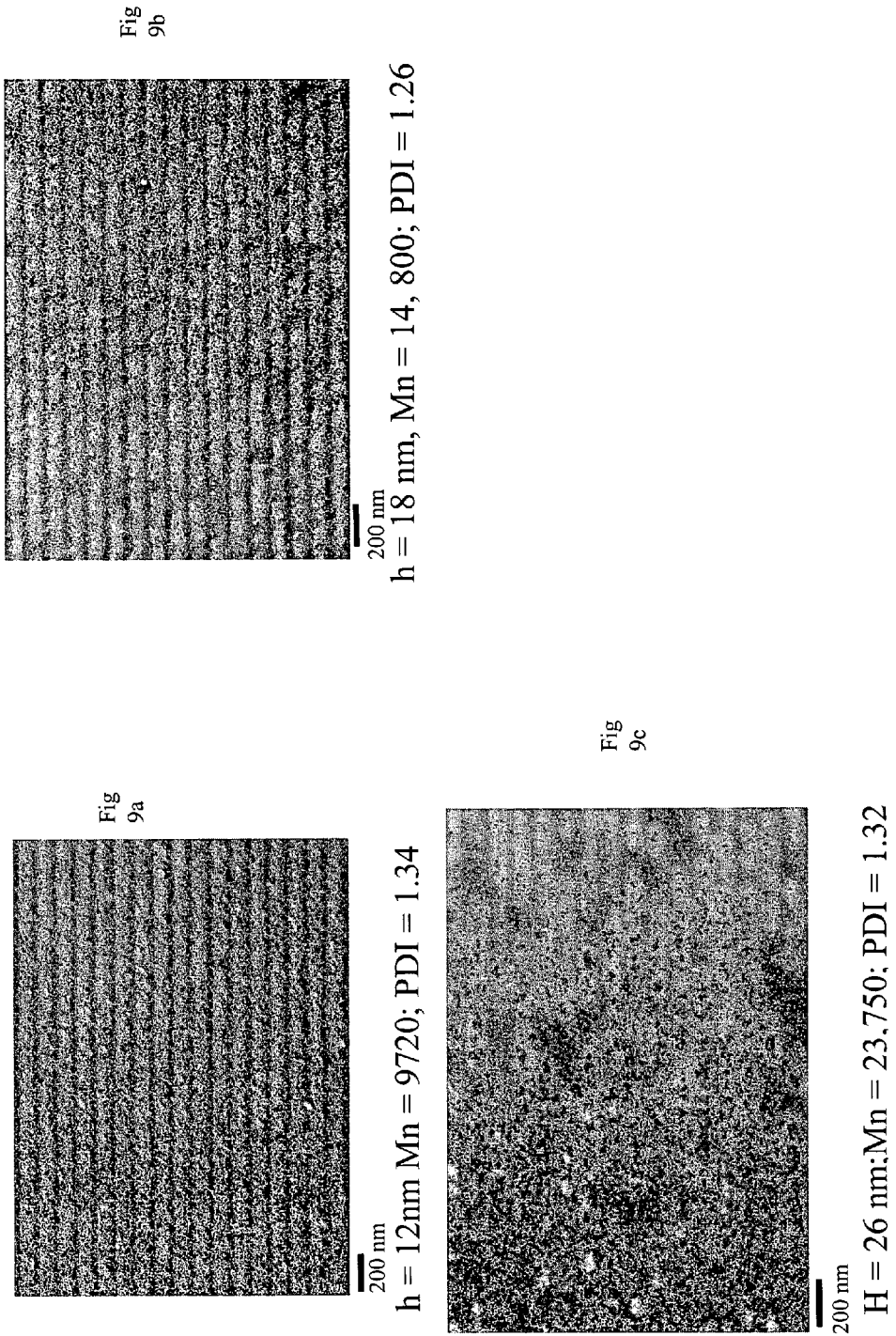
Figs 9a-c: SEM Images of 50 nm Patterned Polystyrene Brushes
G = .7 chains/nm²
Fig 9a: h = 12 nm Mn = 9720; PDI = 1.34
Fig 9b: h = 18 nm, Mn = 14,800; PDI = 1.26
Fig 9c: H = 26 nm; Mn = 23,750; PDI = 1.32

Figs 10a-c SEM Images of 50 nm Patterned Polystyrene Brushes
G = .25 chains/nm²
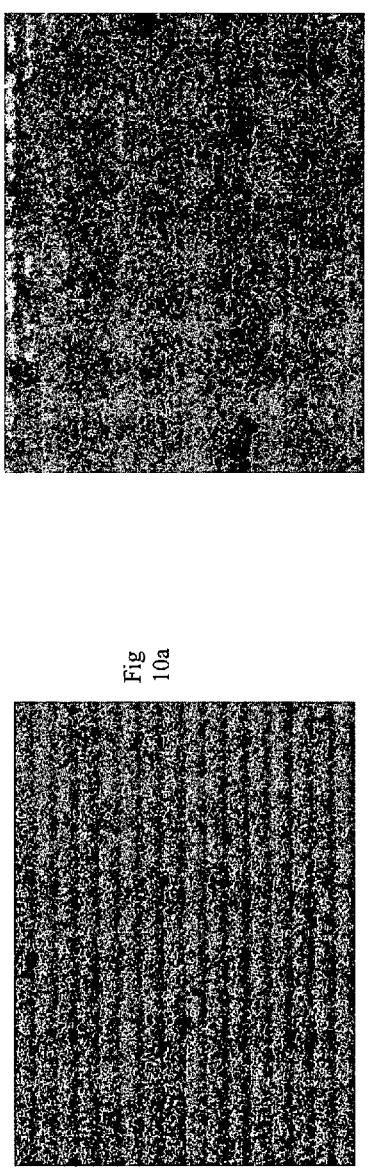
Fig 10a
200 nm
h = 8 nm, Mn = 17,230, PDI = 1.25
Fig 10b
200 nm
h = 13 nm, Mn = 30,290, PDI = 1.35,
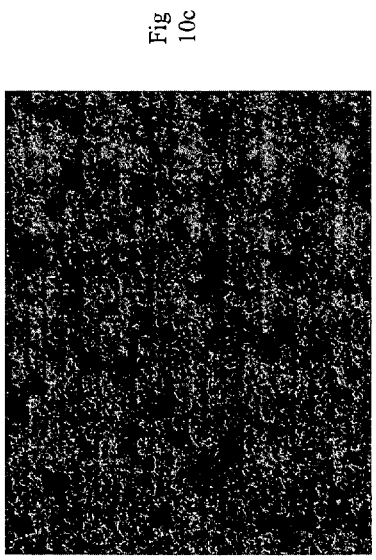
Fig 10c
200 nm
h = 16 nm, Mn = 37,810, PDI = 1.40, Figs 11a-b: SEM Images of 25 nm Patterned Polystyrene Brushes G = .30 chains/nm²

Mn = 17,380, PDI = 1.34, h = 10 nm

Mn = 24,840, PDI = 1.33, h = 12 nm

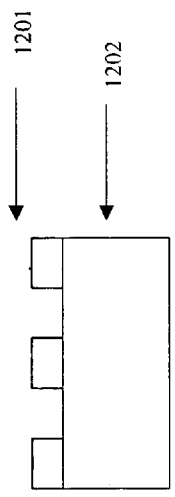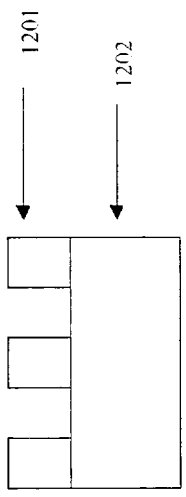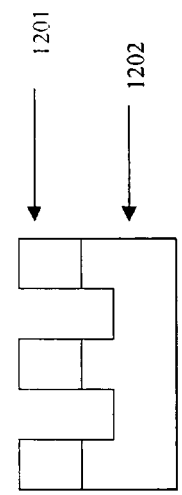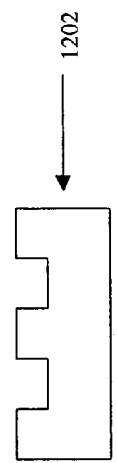
Figs 12a-d

US 7,514,764 B2

MATERIALS AND METHODS FOR CREATING IMAGING LAYERS

CROSS-REFERENCE TO RELATED APPLICATION

This application claims priority under 35 USC § 119(e) from U.S. Provisional Application No. 60/664,797, filed Mar. 23, 2005, hereby incorporated by reference in its entirety and for all purposes.

STATEMENT OF GOVERNMENT SUPPORT

This invention was made with United States government support awarded by the following agency: NSF 0210588. The United States government has certain rights in this invention.

FIELD OF THE INVENTION

The present invention relates to nanoscale patterning. More specifically, the present invention relates to creating nanoscale patterned features using polymer brushes.

BACKGROUND OF THE INVENTION

Production of faster and more powerful integrated circuits in the microelectronics industry requires that the dimensions of devices patterned using advanced lithography continue to decrease. Current high-resolution lithographic processes are based on chemically amplified resists (CARs) and are routinely used to pattern features with dimensions less than 100 nm. As feature dimensions shrink to below 50 nm, however, the use of CARs poses significant new challenges with respect to problems such as line edge roughness, critical dimension control, and collapse of patterned structures due to capillary forces.

Thus, new materials and processes are needed to deliver molecular level control to meet exacting tolerances and margins, and placement of the structures, including registration and overlay, with nanometer precision.

SUMMARY OF INVENTION

The present invention provides patterned features of dimensions of less than 50 nm on a substrate. According to various embodiments, the features may be "Manhattan" style structures, have high aspect ratios, and/or have atomically smooth surfaces. The patterned features are made from polymer brushes grafted to a substrate. In some embodiments, the dimensions of the features may be determined by adjusting the grafting density and/or the molecular weight of the brushes. Once the brushes are patterned, the features can be shaped and reshaped with thermal or solvent treatments to achieve the desired profiles. The chemical nature of the polymer brush is thus independent of the patterning process, which allows for optimization of the polymer brush used for specific applications. Applications include masks for pattern transfer techniques such as reactive ion etching.

One aspect of the invention relates to a patterned substrate; wherein the pattern has one or more features having an aspect ratio of at least 1:100. The features are formed from a plurality of polymer brushes. In certain embodiments, at least some brushes and features have a height of at least 2.5 nm. According to various embodiments, the pattern contains a feature having an aspect ratio of at least 1:10, 1:1, or 2:1. Also, in certain embodiments, the height of the brushes may be at least 5 nm or 10 nm. According to various embodiments, the pattern contains a feature having a width of no more than 50 nm, 25 nm, or 10 nm. Also in certain embodiments, the features in the pattern have substantially vertical sidewalls.

Another aspect of the invention relates to an array of patterned features on a substrate. The features are formed from a plurality of polymer brushes and, in certain embodiments, have a line edge roughness of no more than 10 nm. In particular embodiments, the features have a line edge roughness of no more than 2 nm. Also in certain embodiments, the features have a surface roughness of no more than 5 nm or 2 nm. In certain embodiments, the features have substantially vertical sidewalls and/or have aspect ratios of at least ratios of at least 1:10, 1:1 or 2:1 and/or widths of no more than 50 nm, 25 nm, or 10 nm.

Yet another aspect of the invention relates to a method of reshaping patterned features on a substrate. The method involves patterning the substrate, and after patterning the substrate, treating the patterned features to achieve a desired shape. According to various embodiments, treating the patterned features involves exposing the features to a solvent and/or annealing the features. Also according to various embodiments, the patterned features having aspect ratios of at least 100:1, 10:1, 1:1 or 1:2 and/or substantially vertical sidewalls are created.

Yet another aspect of the invention relates to a method of transferring a pattern to a substrate. The method involves patterning a substrate with polymer brushes to create an etch mask and etching the unmasked areas of the substrate.

These and other aspects of the invention are discussed further below with reference to the drawings.

BRIEF DESCRIPTION OF THE DRAWINGS

FIG. 5a is a schematic showing two distinct polymer brush features collapse into one brush as grafting density, G, and molecular weight, M, are increased past a certain limit.

FIG. 5b shows an image of two distinct polymer brush features and an image of collapsed brush that occurs as G and M are increased past a certain limit. The images were generated from a lattice simulation.

FIGS. 6a-c show feature profiles resulting from a molecular dynamics simulation of polymer brush features.

FIGS. 9a-c show SEM images of substrates patterned with a 50 nm 1:1 linear pattern and a grafting density of 0.7 chains/$nm^2$ using brushes of various molecular weights.

FIGS. 10a-c show SEM images of substrates patterned with a 50 nm 1:1 linear pattern and a grafting density of 0.25 chains/$nm^2$ using brushes of various molecular weights.

FIGS. 12a-d shows an example of using the patterned brushes of the present invention as an etch mask for pattern transfer to a substrate.

DETAILED DESCRIPTION

The present invention provides patterned features of features sizes of less than 50 nm suitable for use in applications such as pattern transfer techniques. Methods for creating the patterned features are also described below. To precisely transfer patterns, it is necessary to have "Manhattan" style features (i.e. features with vertical sidewalls) with high aspect ratios and smooth sidewalls. For some applications, the maximum tolerable line edge roughness is 5-10% of the feature size. For feature sizes on the order of 10-50 nm, line edge roughness should be no more than 0.5-5 nm.

The patterned features of the present invention comprise polymer brushes. A polymer brush is a polymer covalently bonded at one end to a site on a substrate. The sites where the polymer brushes attach to the substrate are referred to as grafting sites. In some instances, the polymer bonded to the substrate is referred to as a polymer brush grafted onto the substrate. The surface or interfacial tension (i.e. polymer:air or polymer:solvent tension) of polymer brushes make them suitable for forming patterned features style features because it yields atomically smooth surfaces—just as surface tension makes a droplet of liquid atomically smooth.

Figure 1:
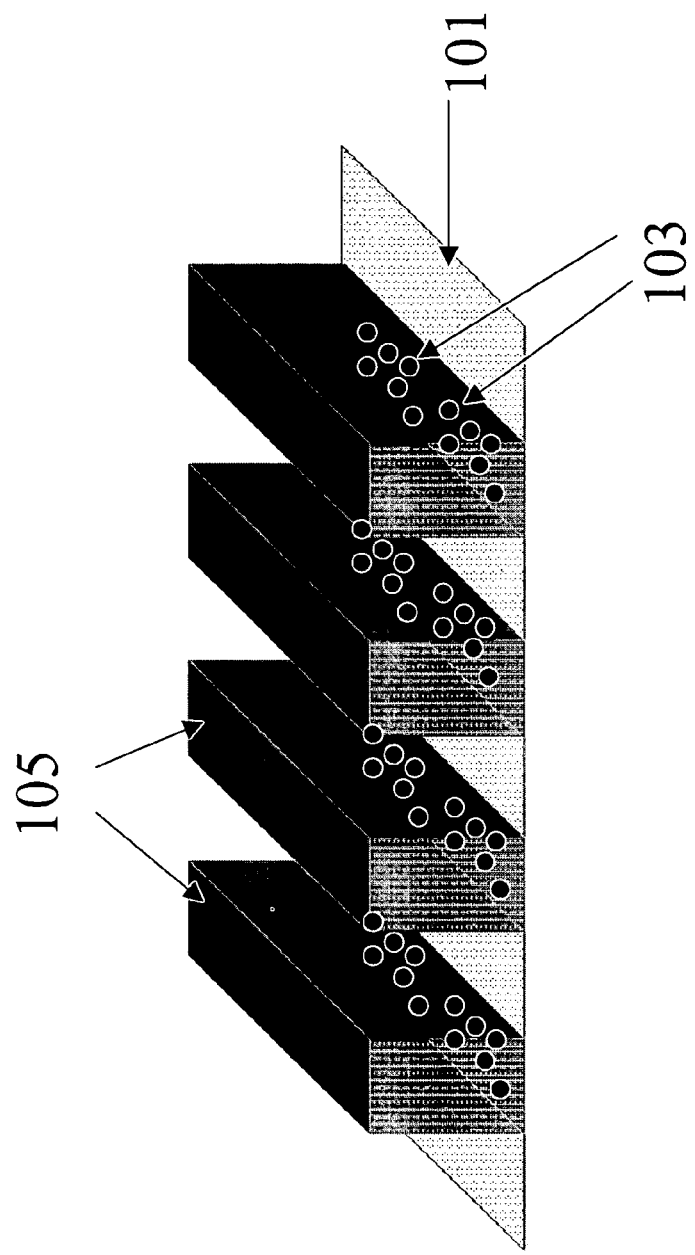
FIG. 1 shows a substrate with patterned features according to one embodiment of the invention.

FIG. 1 shows substrate with patterned features according to one embodiment of the invention. Substrate 101 has grafting sites 103. Features 105 are made of polymer brushes—polymers covalently bonded to a molecule on the substrate at the grafting sites 103. In this embodiment, the grafting sites are initiators attached to the substrate. The grafting density, G, is the number of grafting sites per unit area. (G is also the number of brushes or chains per unit area, as each grafting site is bonded to a brush). Features 105 are Manhattan style features. Manhattan style features are generally rectangular features with substantially vertical sidewalls. As discussed above, Manhattan style patterned features are useful to transfer patterns. In addition to being Manhattan style, features 105 have substantially smooth sidewalls and high aspect ratios.

Figure 2A:
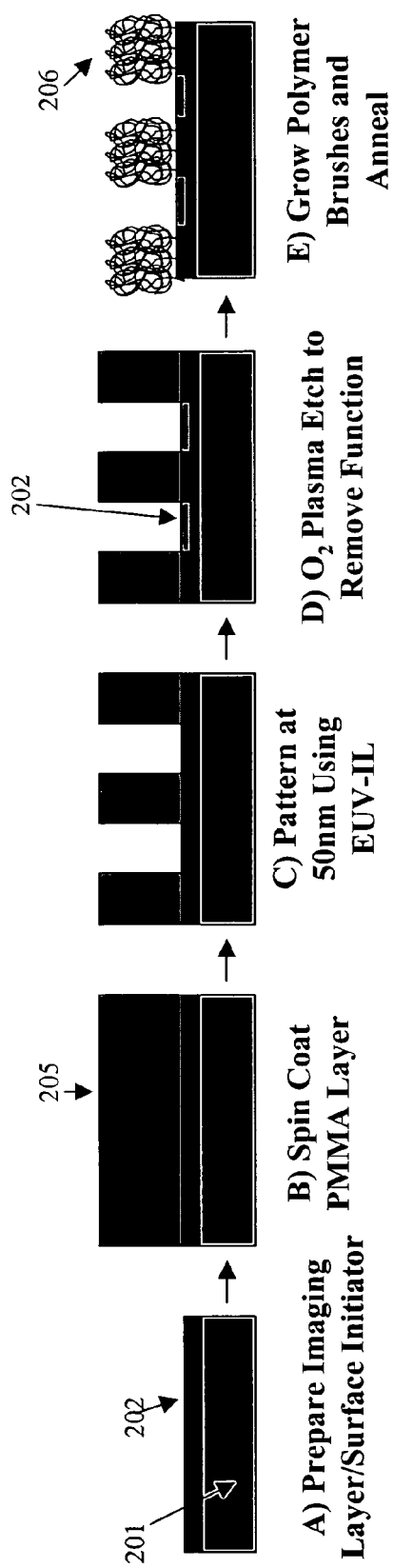
FIGS. 2a-c shows aspects of one method of generating patterned brushes according to various embodiments of the invention.
Figure 2B:
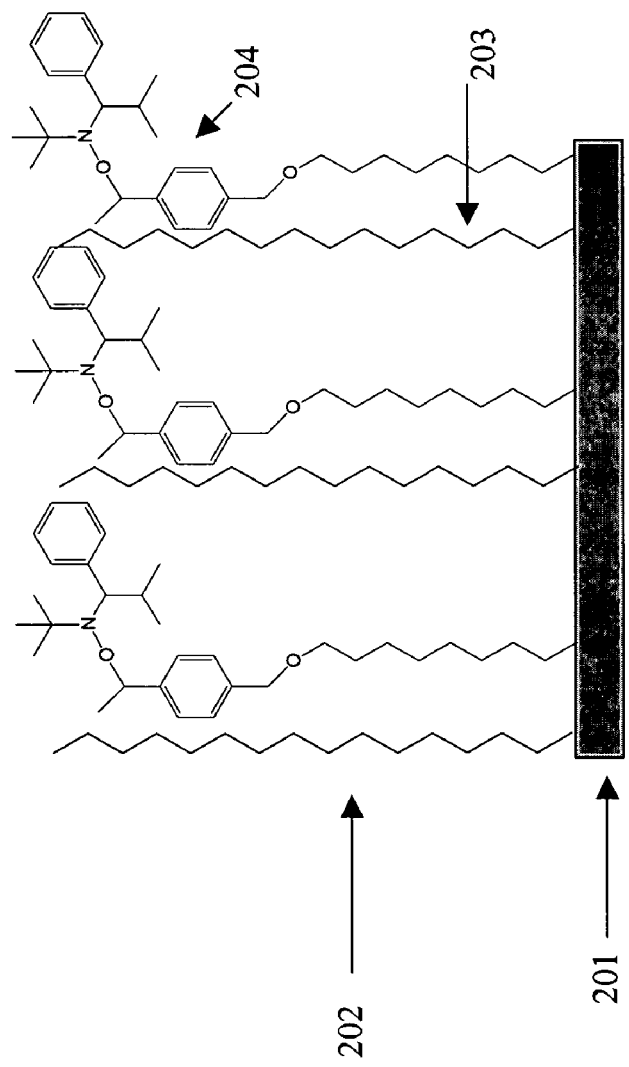

FIG. 2a shows one method of generating the patterned brushes shown in FIG. 1. First, an imaging layer 202 is prepared on a substrate 201 in operation A. The imaging layer contains surface initiator molecules at the desired grafting density. FIG. 2b shows an enlarged view of the imaging layer 202 on the substrate 201.

In the example shown in FIG. 2b, the imaging layer is prepared by forming a self-assembled monolayer (SAM). The SAM in FIG. 2b has inert molecules 203 and molecules with an initiator 204. Any type of suitable SAM may be used, including SAMs of silanes and alkanethiols. The imaging layer is not limited to SAMs, but may be any type of surface (e.g. a polymer surface) that includes or may be chemically modified to have grafting sites.

The initiator shown in FIG. 2b is an alkoxyamine initiator. Any molecule that can be tethered or attached to the surface and covalently bond with the polymer brush may be used. Many initiator molecules for polymer brushes are known in the art. Initiators such as the one shown in FIG. 2b and other initiators are described in Hawker C. J., Bosman A. W. and Harth E., "New polymer synthesis by nitroxide mediated living radical polymerizations," CHEMICAL REVIEWS 101 (12): 3661-3688 December 2001. Other initiators are described in Zhao B. and Brittain W. J. "Polymer brushes: surface-immobilized macromolecules," PROGRESS IN POLYMER SCIENCE 25 (5): 677-710 June 2000. Both of these references are hereby incorporated by reference in their entireties and for all purposes.

Figure 2C:
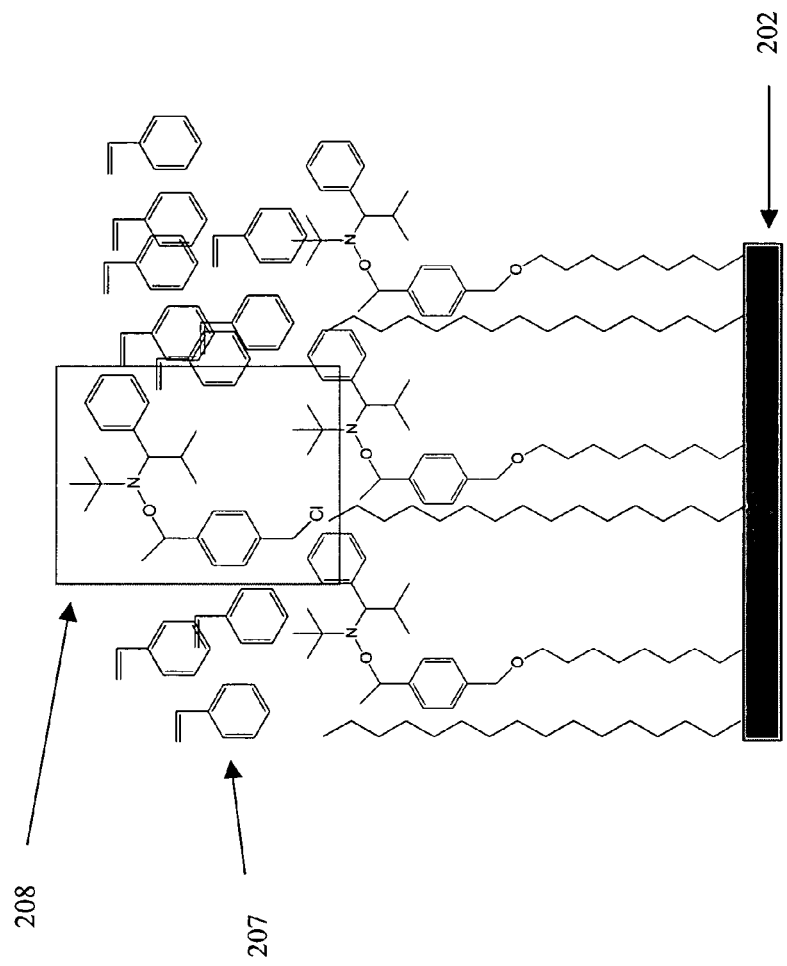

The initiators 204 are attached at the desired grafting density, G. The grafting density could be raised by adding more initiator molecules. After the imaging layer is prepared, a photoresist layer 205 is deposited on the imaging layer 202 as shown in operation B. Photoresist layer 205 is a material that may be patterned by photolithography, for example polymethylmethacrylate (PMMA). Layer 205 is masked and patterned in operation C. As discussed above, the present invention is particularly directed to patterns at scales of 50 nm and below—thus, it is necessary to use a patterning technique capable of nanoscale patterning, for example, extreme ultraviolet (EUV) lithography. Operation D shows the imaging layer 202 etched by an $O_2$ plasma etch. The plasma etch removes the imaging layer and/or destroys the initiator sites at the patterned areas. In operation E, the patterned features 206 are created by growing the polymer brushes and annealing at sites where the imaging layer is functional. FIG. 2c presents an enlarged view of the brushes grown on the imaging layer 202. The brushes are grown in a solution of monomer 207 and free initiator 208. A polymer brush is grown at each grafting site. Free polymers are also grown in the solution. The molecular weight of the polymer brushes grown may be determined by taking a sample of solution and determining the molecular weight of the polymers in solution by any known method.

The method shown in FIGS. 2a-2c involves creating a pattern of initiation sites on the substrate surface, and then polymerizing the brushes at the initiation sites. The patterned brushes could also be made by polymerizing the brushes at the desired G over the entire surface, and then selectively removing areas of the brushes to create the desired pattern. Selective removal may be accomplished, for example, by adaptive electron beam or photolithography.

Figure 3:
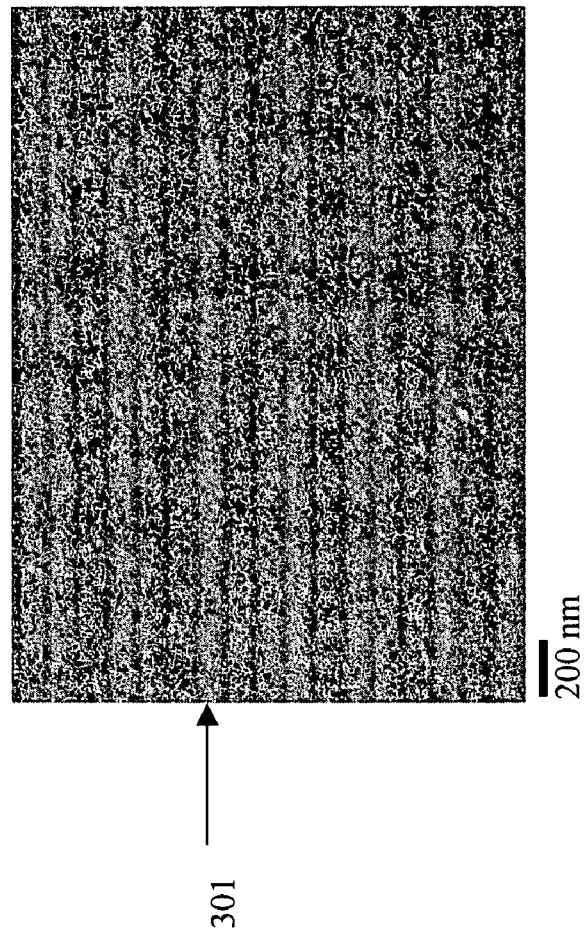
FIG. 3 is an SEM image of patterned features according to one embodiment of the present invention.

FIG. 3 is an SEM image of patterned features according to one embodiment of the present invention. Lines 301 are patterned polystyrene brushes of width 50 nm spaced 50 nm apart (a 1:1 pitch). Grafting density, G, is 0.7 chains/nm$^2$. The height of the features in FIG. 3 is 12 nm. The average molecular weight, M, of the brushes in the pattern is about 9720 g/mol. PDI, the polydispersity index, is equal to Mw/Mn where Mw is the weight average molecular weight and Mn is the number average molecular weight and is used as measure of the width of the molecular weight distribution. Polymer mixtures with PDIs of less than 1.05 have been obtained (with 1 being the PDI where all chains are of the same molecular weight.) It is believed that surface roughness correlates to PDI. In preferred embodiments, the molecular weight distribution is narrow. The PDI of 1.34 for the polymers in the patterned brushes in FIG. 3 indicates a fairly narrow distribution, although one of skill in the art will recognize that the maximum tolerable PDI is dependent on the application.

Height, Grafting Density and Molecular Weight

Figure 4:
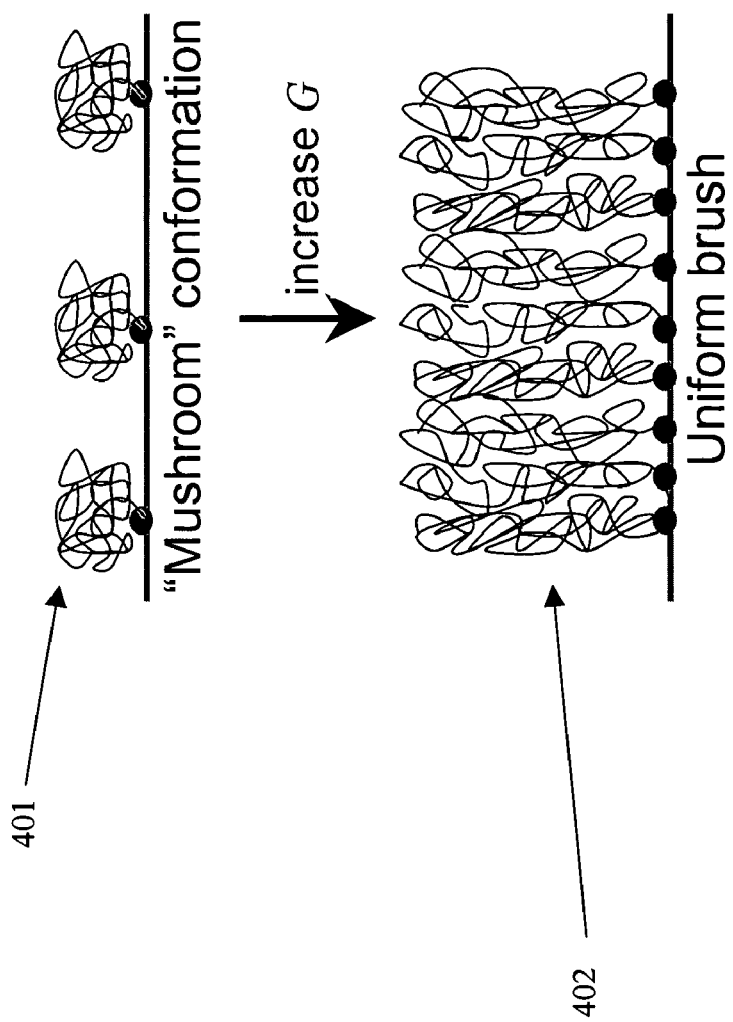
FIG. 4 is a schematic showing "mushroom" and rectangular configurations that polymer brushes may assume on a substrate.

The height, H, of the features is related to the grafting density, G, and molecular weight of the brushes, M. FIG. 4 shows polymer brushes on surface in a rounded or "mushroom" configuration 401 and a rectangular configuration 402. While surface tension of the brushes results in smooth surfaces, these mushroom configurations are not desirable for pattern transfer and other applications. Increasing G, however, results in the brushes extending and adopting a more rectangular configuration as such as configuration 402. As shown in FIG. 1, a feature is formed by multiple brushes if G is high enough that the brushes have the rectangular configuration shown rather than the mushroom configuration.

As shown in FIG. 4, the height of the brushes (and the feature) is a function of G. As G is increased, the height of the brushes increases. Height is also a function of the average molecular weight of the brushes, M. As M is increased, the length of each chain and the height of the feature are increased. (Average molecular weight may be expresses as a weight average or number average. Unless otherwise specified, in this application M refers to the number average molecular weight). It is possible to increase height of the feature by increasing G and M. However, increasing G and M too much results in a collapsed brush. FIG. 5a shows two distinct polymer brush features and a collapsed brush that occurs as G and M are increased past a certain limit. FIG. 5b shows stable and collapsed polymer brush features as modeled in a lattice simulation. The features are modeled as line features—although not shown, the lines extend infinitely in and out of the plane of the paper. The white sites are initiator sites. Stable polymer brushes form discrete features, which may be used for pattern transfer or other applications. Once the brushes are unstable, they collapse to a single form a layer of material on the surface.

Height or aspect ratio of the feature and feature shape may all be controlled by varying G and M constrained by certain limits to avoid collapse. FIGS. 6a-c demonstrate that aspect ratio and profile of features can be controlled by adjusting G and M. FIGS. 6a-c show feature profiles resulting from a molecular dynamics simulation of polymer brush features where the brushes were modeled as chains in a continuum. FIG. 6a shows a feature with G=0.20 chains/nm$^2$ and M approximately 25,000 g/mol. The aspect ratio is 1:1 (10 nm height:10 nm width). FIG. 6b shows a feature with G=0.25 chains/nm and the same molecular weight as the feature in FIG. 6a (25,000 g/mol). The height is 12 nm with aspect ratio 1.2:1. Increasing G by 0.05 chains/nm$^2$ results in a higher aspect ratio. FIG. 6c shows a feature with the same grafting density as the feature in FIG. 6a (0.2 chains/nm$^2$) and M of 50,000 g/mol. The feature has a height of 12 nm and an aspect ratio of 1.2:1. Doubling M results in a higher aspect ratio. The results show that aspect ratio of a feature can be controlled by changing G and/or M.

FIGS. 6a-c also show that feature shape may be controlled by adjusted G and M. The feature in FIG. 6a has a rounded or hill-like profile. Increasing G results in a feature with a more rectangular profile as in FIG. 6b, with nearly vertical sidewalls and a horizontal top. The profile of the feature shown in FIG. 6c is a bubble-like shape with fairly vertical sidewalls and a rounded top. Profile shape can be controlled by adjusting G and/or M. In forming features, vertical sidewalls are generally the most important aspect of the shape. The profiles in FIGS. 6a and 6b have nearly vertical sidewalls—the sidewalls of the profile in FIG. 6b are at a slightly acute angle, and those in FIG. 6c are at a slightly obtuse angle. Perfectly or near-perfectly vertical sidewalls would be obtained with adjusting G and M. Although vertical sidewalls are the most important aspect of the shape for many applications, the overall shape of the features can be optimized for a particular application by adjusting G and M.

As described above, G and M may be varied to control feature properties such as height, aspect ratio and feature shape. G and M are constrained, however, by feature collapse described above with respect to FIG. 5. For example, collapse of a 50 nm patterned polystyrene brush was found to occur at M of 44,000 g/mol, and a height of about 20 nm for a G of 0.25 chains/nm$^2$. The features were exposed to toluene post-patterning. The point at which the features collapse depends on polymer brush used as well as the feature size, G and M, and the particular post-patterning treatment, if any. Since feature collapse is dependent on both G and M, there are not absolute limits on either G or M. However, for a particular feature size, grafting density and post-patterning treatment, an upper limit on molecular weight of the brush may be determined for a particular brush and post-patterning treatment. Similarly, for a particular feature size, molecular weight and post-patterning treatment, an upper limit on grafting density may be determined.

Figure 8:
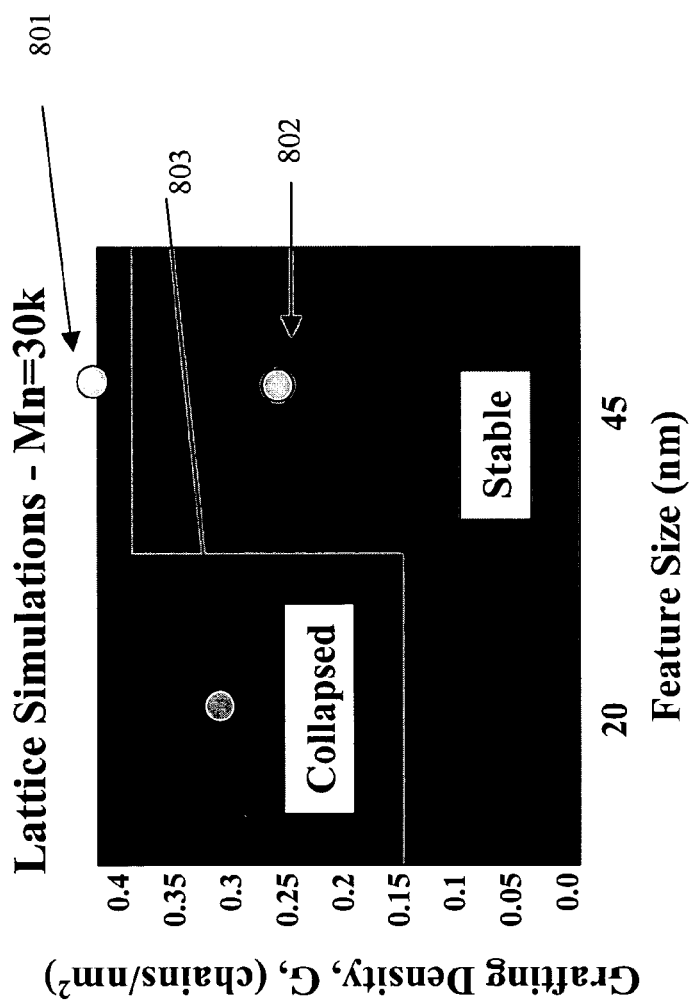
FIG. 8 is a stability diagram showing limits on grafting density for a M of 30,000 g/mol as determined by lattice simulations of line features of brushes.

FIG. 8 is a stability diagram showing limits on grafting density for a M of 30,000 g/mol as determined by lattice simulations of line features of brushes. For feature sizes up to about 35 nm, a grafting density of up to 0.15 chains/nm$^2$ results in stable features. For larger features, grafting density of up to about 0.35 chains/nm$^2$ results in stable features. Similar stability diagrams may be determined for any molecular weight and post-patterning treatment.

Patterned Feature Size

According to various embodiments, the patterned features of the present invention may have a minimum aspect ratio ranging from 1:100 to 2:1. In some embodiments, the features have aspect ratios of at least 1:10, 1:9, 1:8, 1:7, 1:6, 1:5, 1:4, 1:3, 1:2, 1:1, 1.3:1, 1.5:1, 1.7:1, 1.9:1 or 2:1. As discussed above, aspect ratios may be adjusted by varying G and M. Even larger aspect ratios may be obtainable with varying G and M and the post-patterning treatment.

The feature size is the smallest width of a feature in the pattern. For linear features, it is the width of the line. As discussed above, this invention is particularly suitable for pattern with feature sizes of 50 nm or below. The feature size may be about 50 nm, 45 nm, 40 nm, 35 nm, 25 nm, 20 nm, 15 nm, 10 nm, 5 nm or below. In preferred embodiments, the feature size is 25 nm or below. In particularly preferred embodiments, the feature size is about 10 nm or below. Features sizes as small as the width of a polymer brush molecule could be obtained. Feature size is determined by the patterning process, for example the EUV lithographic patterning described in FIG. 2.

Feature height may be any height that may be maintained without collapse. According to various embodiments, feature height is at least about 2.5 nm, 3 nm, 4 nm, 5 nm, 10 nm, 15 nm, 20 nm, 25 nm or 30 nm. In a preferred embodiment, feature height is at least about 2.5 nm.

Roughness

Figure 7:
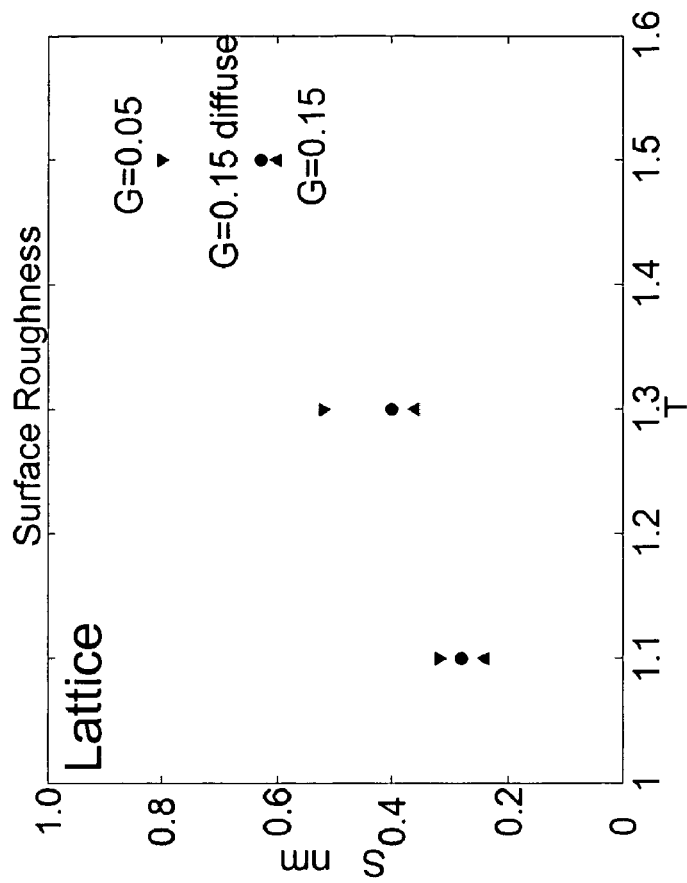
FIG. 7 is a plot of RMS surface roughness of features with G values of 0.05, 0.15 diffuse and 0.15 as a function of temperature.

The polymer brush features are smooth and have low roughness. In certain embodiments, the polymer brush features of the present invention are atomically smooth. Surface roughness measures the amount of variation in the topography of the feature. It should be noted that surface roughness does not measure deviations in the topography at the nanometer scale (e.g. a rounded top) but at the tenth of nanometer scale. Surface roughness has been found to be low for the polymer brushes of the invention regardless of G and M. FIG. 7 is a plot of RMS surface roughness of features with G's of 0.05, 0.15 diffuse and 0.15 as a function of temperature. RMS surface roughness a commonly used measure of surface roughness. It is the root mean square of the deviations of the heights of local features from the mean feature height. The data in FIG. 7 was generated by a lattice model of a feature in which the brushes were modeled as chains on a lattice. "Diffuse" indicates that the model includes defects near the edges of the lines. Values of surface roughness under 1 nm are obtained for all G's in FIG. 7. According to various embodiments, the surface roughness may range from below 1 nm to 10 nm.

Line edge roughness measures the variation in the widths of line features. As with surface roughness, low line edge roughness has been found to result for all values of G and M. According to various embodiments, the line edge roughness may range from less than 1 nm to 10 nm. In preferred embodiments, the line edge roughness ranges from less than 1 nm to 5 nm. In particularly preferred embodiments, the line edge roughness ranges from less than 1 nm to 2 nm. In certain embodiments, the line edge roughness is no more than 10% of the feature size. In preferred embodiments, the line edge roughness is no more than 5% of the feature size.

FIG. 7 also shows that surface roughness is low for a "diffuse" G—i.e. a patterned feature where the grafting density is non-uniform. Non-uniform grafting densities may occur for various reasons, for example non-uniformity in creating the initiator sites or destruction of initiator sides at the edges of the features during patterning. The latter situation was modeled in generating the data in FIG. 7 by introducing defects in G at the edges of the features to create the G=0.15 diffuse. The resulting surface roughness is approximately equal to that of the perfectly uniform pattern of G=0.15. This indicates that even with defects in the grafting density, the polymer brush features of the present invention have low surface roughness. The same result was found with line edge roughness—i.e. that defects due to non-uniformities in the grafting sites did not increase line edge roughness appreciably.

Shaping and Re-Shaping

As explained above, height is a function of grafting density and molecular weight. However, the dependency of height on grafting density (i.e. linear, non-linear, etc.) is solvent-dependent. In good solvents, the height of the brushes is less dependent on grafting density than in bad solvents. For example, the height of polystyrene brushes in benzene (a good solvent) has been found to be proportional to $MG^{1/3}$. In water (a poor solvent), the height is proportional to $MG$, while in cyclohexane (a "theta" or in-between solvent), height is proportional to $MG^{1/2}$. Thus, feature height and aspect ratio of patterned features may be changed by exposing the features to a solvent and letting the material equilibrate. Any solvent that has the desired effect on the patterned features may be used. Examples of solvents are organic solvents such as toluene and supercritical fluids. Another method of adjusting patterned features of a given G and M is by annealing the polymer brush above the glass transition temperature (in the case of an amorphous polymer) and letting the material equilibrate into the desired shape.

Exposure to a solvent and/or annealing the polymer brushes affects the shape of the features. However, because the brushes are covalently bound to the substrate surface, the treatment does not destroy the patterned features.

Because the patterned features may be re-shaped by exposure to a solvent and/or annealing, the chemical nature of the brush may be optimized for post-patterning applications without regard to the patterning process. This is a significant improvement over current photoresist technology where photoresist materials must be optimized to be patterned as well as for post-patterning applications. Using the methods of this invention, the patterned features may be re-shaped as necessary after patterning. According to various embodiments, re-shaping the features may comprise making the features Manhattan style features, i.e. with substantially vertical sidewalls and/or substantially flat tops, changing the aspect ratio of the features and/or reducing the surface and line edge roughness.

Polymer Brushes

A polymer brush is a polymer covalently bonded to a site on a substrate. Any polymer that can be covalently bonded to a site on the substrate and tolerate the conditions of the post-processing treatments and applications may be used. The polymer is generally covalently bonded to an initiator that is bound or tethered to the substrate surface. Any suitable polymer may be used, for example polystyrene (PS). Preferred polymers include styrenes, substituted styrenes, acrylates (e.g. poly methylmethacrylate or PMMA), silanes and siloxanes. Silanes and siloxanes are particularly preferred where high etch resistance is required (for example, if the pattern is to be used as an etch mask). The brush may be tailored for the application. For example, a polymer brush comprising a biologically active molecule (e.g. a polypeptide or polynucleotide) may be used to interact with cells or other molecules. Similarly, a polymer brush may have desired electrical or optical properties.

The molecular weight of the polymers refers to the average molecular weight. Values of M given in this specification are number-average molecular weights. Molecular weight of the polymers may be expressed as equivalent polystyrene molecular weights. Equivalent polystyrene molecular weight refers to a polymer that has a molecular weight equivalent to polystyrene as determined, for example, by gel chromatography. The actual molecular weight may be different from the equivalent polystyrene weight. Although the stiffness of the polymer affects its behavior, a polymer with a certain equivalent polystyrene molecular weight would be expected to behave in generally the same way as polystyrene of that molecular weight. Thus, values of M known to work for polystyrene may be generalized to all polymers.

The molecular weight may be any value that does not result in collapse of the polymer brush features. As discussed above, feature collapse is dependent on G and feature size and post-patterning treatment. General guidelines, based on experiments, are as follows: For a feature size around 50 nm with a grafting density of less than 0.7 chains/nm$^2$, equivalent polystyrene molecular weights of less than 25,000 g/mole are stable. For features sizes around 50 nm and a grafting density less than 0.25 chains/nm$^2$, equivalent polystyrene molecular weights of less than about 45,000 g/mole are stable. For feature sizes between about 20-30 rum with grafting density is less than about 0.4 chains/nm$^2$, equivalent polystyrene molecular weights of less than about 30,000 g/mole are stable. Collapse is also a function of the distance between patterns. In all the preceding examples, the distance between features is equal to the feature size, i.e. the pitch of the pattern is 1:1. However, in a pattern where distance between features is greater or less than the feature size, the allowable molecular weight will be increased or decreased accordingly. For example, for a feature size of 30 nm and a pitch of 1:2 (i.e. 30 nm features with a 60 nm space between features), larger heights and molecular weights may be obtained than for the same size feature and a 1:1 pitch. The molecular weights given above are also based on a post-patterning exposure to toluene. Values for different post-patterning treatments may vary.

Patterns

Although the above discussion and below examples refer to linear patterns, the patterned features and methods may be used with any type of pattern, including dense lines and arrays of dots. The patterned features may be irregular patterned features (e.g. including angles). The pattern may include any type feature found in patterns useful in the microelectronics industry.

The invention is particularly suited for patterns with features sizes of 50 nm below.

Applications

The patterned features may be used for pattern transfer techniques. For example, the patterned brush features may be used as an etch mask in reactive ion etching. The patterned features may also be functional. For example, polymer brushes features incorporating nucleic acid or peptide sequences could be used to interact with cells. Polymer brushes features may also have electrical or optical functions (e.g. the features may be electrically conductive).

FIGS. 12a-d show an example of how the patterned brushes of the present invention may be used as an etch mask for pattern transfer to a substrate. The substrate may be a silicon wafer substrate. In some embodiments, the wafer may have additional layers that require patterning, such as dielectric materials, deposited on it. In FIG. 12a, polymer brush features 1201 are patterned on substrate 1202. For this application, a polymer with a high etch resistance such as a silane or siloxane is preferred. As discussed above in the context of FIGS. 2a-c, patterning the substrate may involve creating patterned initiation sites on a substrate and growing polymer brushes at the patterned sites. Other methods of patterning include growing polymer brushes across the surface of the substrate and selectively removing brushes to create the desired pattern. After patterning the substrate, the polymer brushes may be treated by exposure to a solvent or annealing in FIG. 12b to achieve the desired feature height and profile for the mask. In FIG. 12c, the substrate is etched with an reactive ion etch to transfer the pattern into the substrate. The polymer brushes may then be removed in FIG. 12d. One of skill in the art will understand that the process depicted in FIGS. 12a-d is an example and other known pattern transfer processes and techniques may be used in conjunction with a polymer brush etch mask.

EXAMPLES

The following examples provide details illustrating aspects of the present invention. These examples are provided to exemplify and more clearly illustrate these aspects of the invention and are in no way intended to be limiting.

Example 1

Substrates with an imaging layer with initiator sites of grafting density G of 0.7 chains/nm$^2$ were prepared as discussed above with respect to FIG. 2. A PMMA photoresist layer was spun on the imaging layer and patterned using EUV-IL. The resulting pattern on each substrate was a 1:1 50 nm linear pattern (i.e. 50 nm lines, spaced 50 nm apart). Polystyrene patterned brushes were then grown on the substrates. The reaction was stopped at the desired molecular weight and the samples were placed in a Soxhlet extractor and exposed to a toluene solvent for 48 hours. The samples were then removed from the solvent and dried.

Patterned brushes of various molecular weights were grown and observed. Molecular weight was increased until feature collapse was observed. Feature collapse is the point at which discrete features are no longer observed. FIGS. 9a-c show SEM images of the patterned brushes with various molecular weights. The average molecular weight of the patterned brushes in FIG. 9a is 9720 g/mol with PDI equal to 1.34. Feature height is 12 nm. As can be seen in FIG. 9a, the patterned features are substantially defect-free. FIG. 9b shows a patterned brush with brushes of 14,000 g/mol and a PDI of 1.26. Height is 18 nm. The patterned features in FIG. 9b have more defects (due to polymer chains bridging gaps) than those in FIG. 9a. The patterned brush in FIG. 9c has a molecular weight of 23,750 g/mol, a PDI of 1.32 and a height of 26 nm. Increasing M (and height) leads to more defects due to chains bridging gaps as can be seen in comparing FIG. 9c to FIG. 9b. Feature collapse occurred at an M of 26,800 g/mol and a feature height of about 30 nm.

Example 2

Substrates with a 50 nm 1:1 linear pattern and a grafting density of 0.25 chains/nm$^2$ were prepared as in Example 1. FIGS. 10a-c show SEM images of the patterned brushes with various molecular weights.

The average molecular weight of the patterned brushes in FIG. 10a is 17,230 g/mol with PDI equal to 1.25. Feature height is 8 nm. The patterned features are well ordered with few defects. As with the 0.7 chaims/nm$^2$ in Example 1, increasing M results in taller features and more defects. FIG. 10b shows a patterned brush with brushes of 30,290 g/mol and a PDI of 1.40. Height is 13 nm. The patterned features in FIG. 10b have more defects than those in FIG. 10a. The patterned brushes in FIG. 10c have a molecular weight of 37,810 g/mol, a PDI of 1.4 and a height of 16 nm. Defects are observed throughout the pattern. Feature collapse occurred at an M of 44,000 g/mol and a feature height of about 20 nm.

The results shown in Examples 1 and 2 demonstrate that lower grafting density (i.e. fewer chains per unit area) require larger polymers (higher M) to get reach a certain height. Brushes of 9,720 g/mol are required to achieve a feature height of 12 nm for a G of 0.7 chains/nm$^2$ (FIG. 9a), while brushes of 30,290 g/mol are required to achieve about the same feature height for a G of 0.25 chains/nm$^2$ (FIG. 10b).

A nearly defect free pattern was formed over a 0.3 mm$^2$ area with G=0.25 chains/nm$^2$ and M=20,000 g/mol.

Example 3

Figures 11A, 11B:
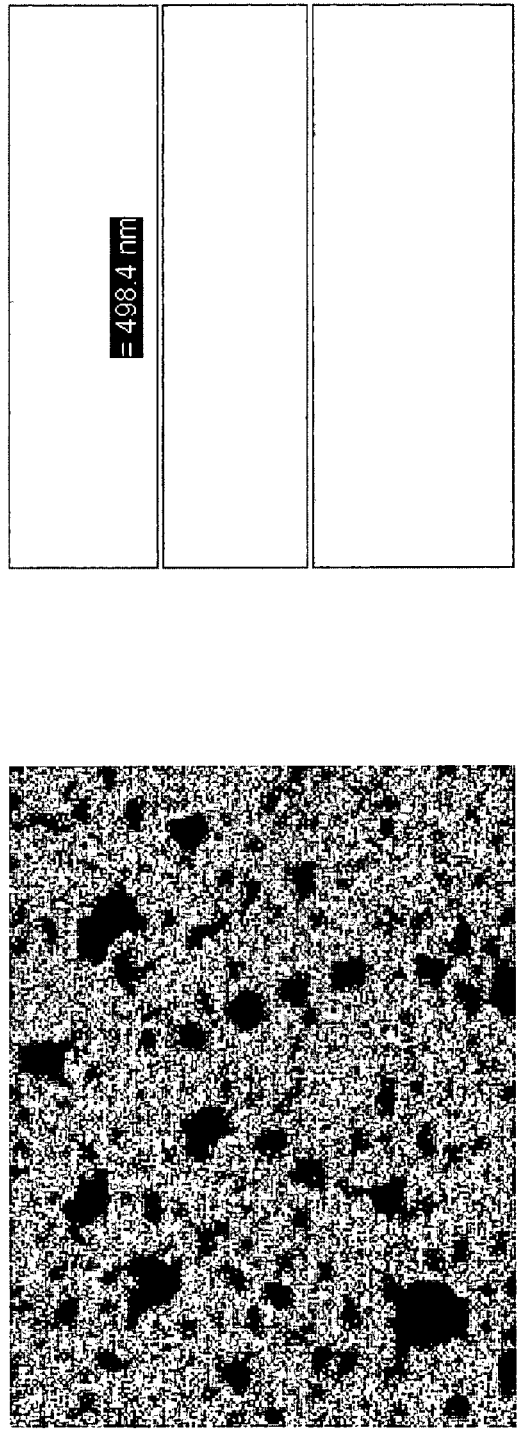
FIGS. 11a and b show SEM images of substrates patterned with a 25 nm 1:1 linear pattern and a grafting density of 0.3 chains/$nm^2$ using brushes of various molecular weights.

Substrates with a 25 nm 1:1 linear pattern and a grafting density of 0.30 chains/nm$^2$ were prepared as described in Example 1. FIGS. 11a and 11b show SEM images of the patterned brushes with various molecular weights. The brushes in FIG. 11b have a M of 17,380 g/mol, a PDI of 1.34 and a height of 10 nm. Large areas of defects are observed. FIG. 11b shows patterned brushes with M of 24,840, a PDI of 1.33 and a height of 12 nm. As with the pattern shown in FIG. 11a, large areas of defects are observed. Feature collapse occurred at an M of 30,250 g/mol and a height of about 14 nm. Defects due to chains bridging the gaps occurred at all molecular weights. This is due to the fact that gaps of the patterns are 25 nm. Increasing the gap width (i.e. changing the pitch) for a feature size of 25 nm would result in fewer defects.

Example 4

Multiscale modeling of patterned polymer brushes was done to determine stability, achievable aspect ratios, side wall and surface roughness and robustness of the structure to defects. Patterned brushes were modeled as chains on a cubic lattice (scale around 10 nm), as chains in a continuum (scale around 1 nm) and as atomistic (scale around 0.2nm).

The stability of patterned polymer brushes was predicted from modeling the brushes as chains on a cubic lattice. FIG. 5b shows stable and collapsed polymer brush features as modeled. The features are modeled as line features—although not shown, the lines extend infinitely in and out of the plane of the paper. The white sites are initiator sites. Results of a simulation with M=30,000 g/mol appear in FIG. 8. For feature sizes up to about 35 nm, a grafting density of up to 0.15 chains/nm² results in stable features. For larger features, grafting density of up to about 0.35 chains/nm² results in stable features. The white points 801-803 on the stability graph in FIG. 8 correspond to experimental data of collapse given above in Examples 1-3 for particular grafting densities and feature sizes. Point 801 represents the 50 nm brushes with G=0.7 chains/nm² (Example 1; shown in FIG. 8 at G>0.4 chains/nm²) and point 803 represents the 25 nm brushes with G=0.25 chains/nm² (Example 3). Collapse of these features occurred at M's of approximately 30,000 g/mol. As can be seen from FIG. 8, at an M of 30,000 g/mol, points 801 and 803 are within the collapsed region and thus in agreement with the model. Point 802 represents the 50 nm brush with G=0.25 chains/nm² (Example 2). Collapse of the brush occurred at 44,300 g/mol; at 30,000 g/mol, the features were well within the stable region, also in agreement with the model.

Features profiles were modeled as chains in a continuum using a molecular dynamics simulation. Results are discussed above with respect to FIGS. 6*a-c*.

Surface roughness as a function of grafting densities was determined using an atomistic model. Results are discussed above with respect to FIG. 7 and show that surface roughness is on the order of 1.0 nm or less. It is notable that the RMS surface roughness for G=0.15, diffuse is nearly equivalent to that for G=0.15. This result shows that smooth surfaces are obtainable even where there are defects in the placement of grafting sites.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

The invention claimed is:

1. A pattern on a substrate comprising a feature having an aspect ratio of at least 1:100, the feature comprising a plurality of polymer brushes attached to the substrate and having a height of at least 2.5 nm and wherein the width of the feature is no more than about 50 nm.

2. The pattern of claim 1, wherein the aspect ratio is at least 1:10.

3. The pattern of claim 1, wherein the aspect ratio is at least 1:1.

4. The pattern of claim 1, wherein the aspect ratio is at least 2:1.

5. The pattern of claim 1, wherein the height is at least 5 nm.

6. The pattern of claim 1, wherein the height is at least 10 nm.

7. The pattern of claim 1, wherein the width of the feature is no more than about 25 nm.

8. The pattern of claim 1, wherein the width of the feature is no more than about 10 nm.

9. The pattern of claim 1, wherein the feature has a size of about 50 nm and a grafting density of less than about 0.7 chains/nm² and the equivalent polystyrene molecular weight of the polymer brush is less than about 25,000 g/mole.

10. The pattern of claim 1, wherein the feature has substantially vertical sidewalls.

11. The pattern of claim 1, wherein the feature has a line edge roughness of no more than 10 nm.

12. The pattern of claim 1, further comprising at least one additional feature having an aspect ratio of at least 1:2.

13. An array of patterned features on a substrate; wherein the features comprise polymer brushes and have a line edge roughness of no more than 10 nm an aspect ratio of at least 1:100, a height of at least 2.5 nm, and a width of no more than about 50 nm.

14. The array of patterned features of claim 13, wherein the features have a line edge roughness of no more than 2 nm.

15. The array of patterned features of claim 13, wherein the features have a surface roughness of no more than 5 nm.

16. The array of patterned features of claim 13, wherein the features have a surface roughness of no more than 2 nm.

17. The array of patterned features of claim 13 wherein the features have substantially vertical sidewalls.

18. The array of patterned features of claim 13, wherein the features have aspect ratios of at least 1:10.

19. The array of patterned features of claim 13, wherein the features have widths of no more than 25 nm.

* * * * *